(12) United States Patent
Hayakawa et al.

(10) Patent No.: US 6,709,720 B2
(45) Date of Patent: Mar. 23, 2004

(54) MARKING METHOD AND MARKING MATERIAL

(75) Inventors: Hirotoshi Hayakawa, Fukuoka (JP); Shuichi Takanami, Saitama (JP)

(73) Assignees: Kabushiki Kaisha Yaskawa Denki, Kitakyushu (JP); Ye Data Inc., Iruma (JP)

( * ) Notice: Subject to any disclaimer, the term of this patent is extended or adjusted under 35 U.S.C. 154(b) by 0 days.

(21) Appl. No.: 09/380,630

(22) PCT Filed: Mar. 17, 1998

(86) PCT No.: PCT/JP98/01110

§ 371 (c)(1),
(2), (4) Date: Sep. 20, 1999

(87) PCT Pub. No.: WO98/42474

PCT Pub. Date: Oct. 1, 1998

(65) Prior Publication Data

US 2003/0039765 A1 Feb. 27, 2003

(30) Foreign Application Priority Data

Mar. 21, 1997 (JP) .............................................. 9-068596

(51) Int. Cl.⁷ .......................... B05D 3/06; C23C 14/28; C23C 14/32; C23C 14/58; B44C 1/22
(52) U.S. Cl. ...................... 427/555; 427/556; 427/596; 427/597; 216/94
(58) Field of Search ................................. 427/555, 556, 427/561, 559, 596, 597; 216/94

(56) References Cited

U.S. PATENT DOCUMENTS

| | | | |
|---|---|---|---|
| 3,745,586 A | * | 7/1973 | Braudy |
| 3,978,247 A | * | 8/1976 | Braudy et al. |
| 4,064,205 A | | 12/1977 | Landsman |
| T988,007 I4 | | 11/1979 | Drew et al. .................. 427/597 |
| 4,190,759 A | * | 2/1980 | Hongo et al. ......... 219/121 IM |
| H158 H | | 11/1986 | Frausto et al. ............... 219/121 |
| 4,743,463 A | | 5/1988 | Ronn et al. .................. 427/597 |
| 4,895,735 A | | 1/1990 | Cook |
| 5,065,697 A | * | 11/1991 | Yoshida et al. ............. 427/596 |
| 5,164,565 A | * | 11/1992 | Addiego et al. ............ 427/556 |
| 5,281,575 A | | 1/1994 | Hase et al. .................. 427/557 |
| 5,567,336 A | | 10/1996 | Tatah .......................... 427/555 |
| 5,855,969 A | * | 1/1999 | Robertson .................... 427/556 |
| 5,935,462 A | | 8/1999 | Tatah .......................... 427/556 |
| 6,132,818 A | * | 10/2000 | Tanaka et al. .............. 427/596 |
| 6,583,381 B1 | * | 6/2003 | Duignan ................. 219/121.69 |

FOREIGN PATENT DOCUMENTS

| | | | |
|---|---|---|---|
| JP | 58-007117 | * 1/1983 | .................. 216/65 |
| JP | 60-061193 | 4/1985 | |
| JP | 6-061193 | 3/1994 | |
| JP | 6-155920 | 6/1994 | |

OTHER PUBLICATIONS

Abstract of JP 60–0224588A to Shizuo Furukawa, at Seiko instr. IN/A Electronics,L.T.D. 927/555,596, Nov. 8, 1985.*

* cited by examiner

*Primary Examiner*—Marianne Padgett
(74) *Attorney, Agent, or Firm*—Oblon, Spivak, McClelland, Maier & Neustadt, P.C.

(57) ABSTRACT

A method of marking materials, wherein the surface of a marking material and the surface of a material to be marked are matched, a laser beam is applied to the marking material while scanning the beam to form a mark, the material to be marked consisting a transparent body on which a pattern of a character or the like is formed. The method for marking comprises a first step of applying the laser beam to the marking material with the first laser power to evaporate the marking material and make them deposit to a predetermined part of the material to be marked, a second step of applying a laser beam to the deposited matter on the material to be marked with a second laser power to remove or transform the deposited mater. Steel or stainless steel is used as the marking materials.

4 Claims, 15 Drawing Sheets glass plate
2
1
metal plate

LA
2
1a
1 chromium thin film  MC

LA
2
3 symbol

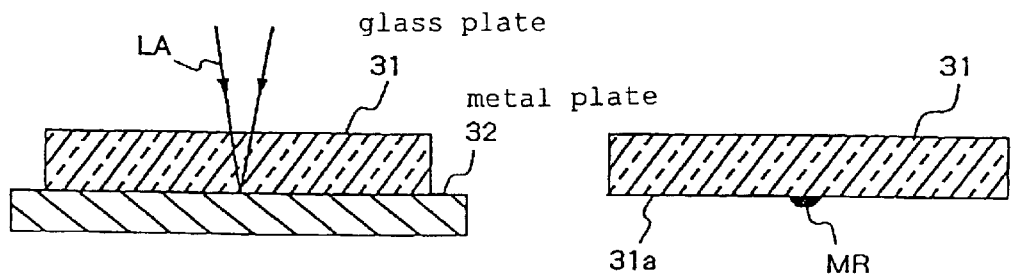
Fig. 17(a)　　　　　Fig. 17(b)
Fig. 18
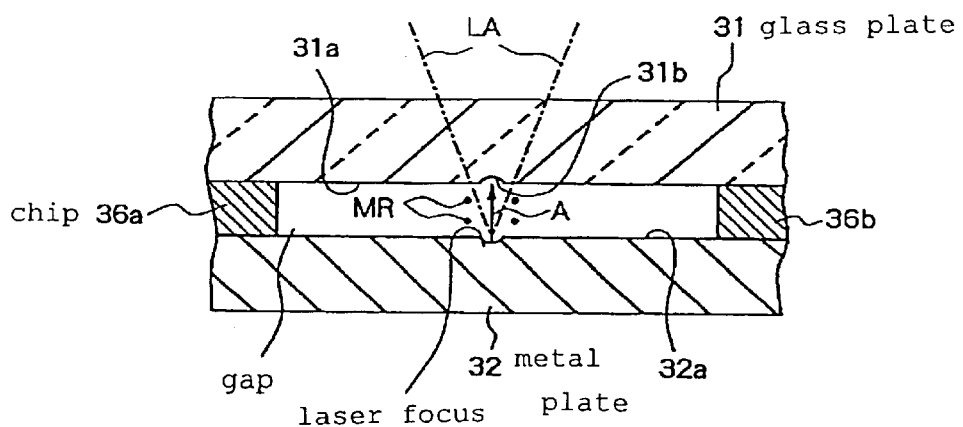

MARKING METHOD AND MARKING MATERIAL

TECHNICAL FIELD

The present invention relates to a method and materials for forming a mark such as a product number or a lot number on glass or on-a laser transmittive body used as a component of a liquid crystal panel, a plasma display panel or a semiconductor substrate or the like.

BACKGROUND ART

Methods of marking on a transparent body such as glass or a laser transmittive body have been disclosed in Japanese Patent Laid-open No. 008634/1994 and Japanese Patent Laid-open No. 155920/1994.

FIG. 16 and FIG. 17 show the prior art disclosed in Japanese Patent Laid-open No. 008634/1994. In FIG. 16, the numeral 31 represents a glass plate, 32 a metal plate made of material such as stainless steel, phosphor bronze or aluminum, 33 a condensing lens, and 34a and 34b are x-axis and y-axis rotation mirrors for scanning the laser beam LA, and 35a and 35b are galvanometer scanners of x-axis and y-axis rotation mirrors, respectively. According to the marking method of the prior art, the glass plate 31 and the metal plate 32 are closely contacted with each other, a laser beam is applied through the glass to the surface of metal plate 32, a desired pattern such as of a character, a diagram or a symbol, is formed with the heated metal of metal plate 32 by the laser beam irradiation is deposited to the glass plate. By applying the laser beam LA as shown in FIG. 17(a) and separating glass plate 31 from metal plate 32 as shown in FIG. 17(b), metal particles MR deposited to the surface of glass plate 31a is obtained showing the marking of the pattern having the metal color of metal plate 32.

FIG. 18 shows the prior art disclosed in Japanese Patent Laid-open No. 155920/1994. This conventional example uses the same apparatus as shown in FIG. 16, and as shown in FIG. 18, chips 36a and 36b of a thickness of 0.2 to 0.5 mm are placed between glass plate 31 and metal plate 32 to form a gap therebetween. Then a laser beam is applied with a desired pattern such as of a character, a diagram or a symbol through the glass plate to the surface of metal plate 32 to locally heat the surface of metal plate 32a irradiated by the laser beam, thereby emitting matter such as metal particles MR, ions or plasma from metal plate 32 in the direction of the arrow A. As shown in FIG. 18, a part of the matter emitted strikes the surface of confronting glass plate 31, thereby removing surface 31a of glass plate 31 by the shock while forming dent 31b. When glass plate 31 is separated from metal plate 32, dent 31b appears to be white or milky white. Therefore, when the laser beam is applied with a desired pattern while scanning, white marks are formed showing the pattern on the surface of glass plate 31. As described above, there have been two methods for marking on a transparent body such as a glass plate.

However, in the prior art disclosed in Japanese Patent Laid-open No. 008634/1994, since the evaporation area of the metal spreads wider than the diameter of the laser beam, when the laser beam is applied to the metal, it is unable to form minute marks. Further, when a laser beam is applied to metal, since the temperature of the metal is raised as high as the fusion temperature and the metal is closely contacted with the glass surface, the temperature of the closely contacted glass plate is also highly raised locally. Consequently, a crack is occasionally generated in the glass plate which is weaker than the metal plate in thermal shock, or at the worst, the glass plate is broken.

On the other hand, in the prior art disclosed in Japanese Patent Laid-open No. 155920/1994, there is a gap of 0.2 to 0.5 mm between the glass plate to be marked and the metal plate, and since matter such as metal particles MR, ions or plasma generated by irradiation of the laser beam and spread into a two dimensional area, it is not possible been unable to form delicate marking. Further, since the mark is white or milky white in color, it is hard to recognize visually, and with an instrument having a photodetector such as a barcode reader, it is completely impossible to recognize the marked codes or characters. Further, since a dent is formed in the surface of the glass plate, the bending strength of the glass decreases remarkably. Particularly, in the case of thin glass plate of the thickness of 1 mm or less used as liquid crystal panels, the glass plate is sometimes broken by the bending stress due to dead weight, while precludes mechanical transportation.

Recently, forming marks on a liquid crystal panel or a plasma display panel has been not only for forming product numbers, but also for forming QR Code, Data Code, Veri Code or two-dimensional bar codes or bar codes on a glass plate in the initial process of manufacture for process control of each panel substrate. Therefore, it is greatly required that the mark is of easy recognition, uniform quality, stable and unchanging in quality during manufacture, and low cost.

However, with a marking material of the prior art, the mark such as symbol etc. disappears due to heat treatment in the manufacturing process, and it is difficult to form a predetermined configuration in some marking material, both of which result in increased costs.

Also, in the methods of the prior art, there are problems such as uneveness of thickness of the film on which the mark is formed on a glass plate, part of a mark disappears, and at worst the code can not be read with a data code reader. This is because the film of the code mark is required to shield light completely for reading a code with a code reader, but if there is irregularity in film thickness, the quantity of light shielded by the film of the mark varies, and correct reading of the mark is interrupted thereby.

DISCLOSURE OF INVENTION

It is an object of the present invention to provide a method of marking for easily and uniformly forming a minute mark, which has not been realized by the prior art, on a transparent body such as glass or a laser transmittive body. Such a marking method is required to obtain easy visual recognition and instrument reading of a mark, while supplying a marked plate with high strength against bending and which does not cause to crack or fracture from the thermal shock given to the glass plate.

The present invention also provides a marking material for a heat-and-chemicals-proof code mark.

The present invention achieves the above stated object by providing a method for marking materials using a material to be marked and a marking material consisting of a transparent body or a laser transmittive body, comprising a first process of placing the surface of said material to be marked and the surface of said marking material together with a desired gap therebetween, vaporizing said marking material by irradiating it through said material to be marked with a beam of a first laser power while scanning with the laser beam, and depositing a deposit vaporized from said marking material to a predetermined portion of said material to be marked and a second process of removing or denaturalizing said deposit deposited to the surface of said material to be marked with a laser beam of a second laser power, whereby, patterns of characters, diagrams or symbols are formed on said material to be marked.

The present invention further provides a method for marking materials to form patterns of characters, diagrams or symbols on a material to be marked consisting of a transparent body or a laser transmittive body comprising the steps of creating a desired gap between the surface of said material to be marked and the marking material, reacting the gas which exists in said gap from the vaporization of said marking material irradiated by said laser beam with the vaporized marking material, and adhering the reaction product onto the surface of said material to be marked.

In addition, the present invention provides a method for marking materials comprising steps of forming patterns of characters, diagrams or symbols by changing the light transmittivity or the light reflection factor of the deposit consisting of the marking material deposited to the transparent body or laser transmittive body by irradiating with a laser beam.

A metal, an alloy, an intermetallic compound or a metal compound, or a compound which includes at least one of said metal, alloy, intermetallic compound or metal compound, and in particular a steel or stainless steel is used as the marking material.

According to the present invention, since marking is done by adhering a film onto a glass plate in a first process and partially removing the film in a second process, clear fine marks can be obtained effectively. Also, since the glass plate is not damaged, the glass plate does not break and moreover, a mark with a high bending strength can be effectively provided.

Since the present invention employs stainless steel or steel as a marking material, a heat-and-chemicals-proof code mark can be formed, thereby assuring reliable code recognition on the production line.

Also, as thin film is used on the marking material comprising of a laser transmittive body like a glass plate, a code mark can be formed having a uniform film thickness, making stable code recognition possible.

BRIEF DESCRIPTION OF DRAWINGS

FIG. 17 is a sectional view of the prior art making.

FIG. 18 is a sectional view showing the appearance of marking in the prior art.

BEST MODE FOR CARRYING OUT THE INVENTION

Embodiments of the present invention will be described below with reference to the drawings.

(Embodiment 1)

Figure 1:
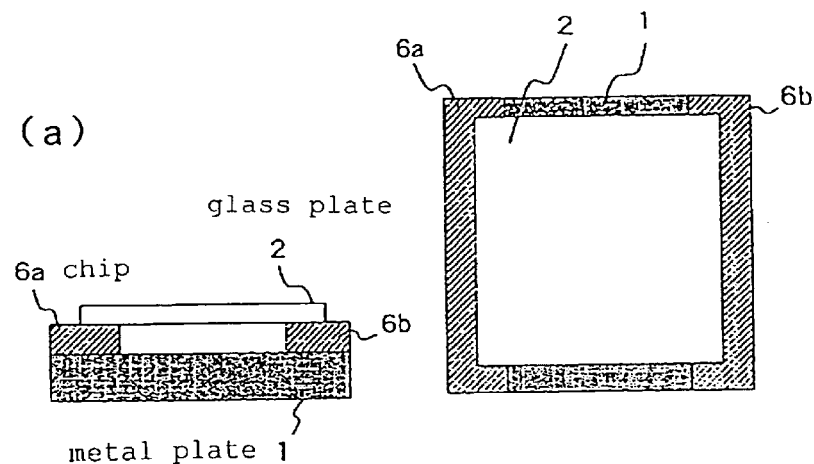
FIG. 1 is a sectional view and a plan view of a marking process with reference to embodiment 1.
Figure 1:
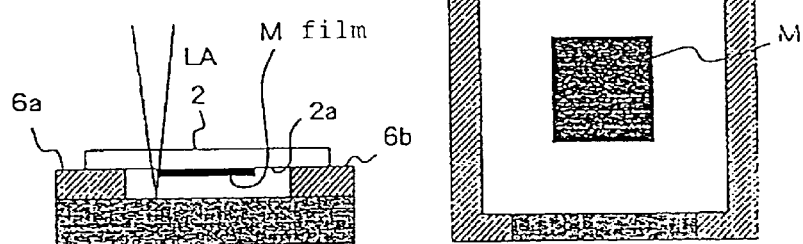
Figure 1:
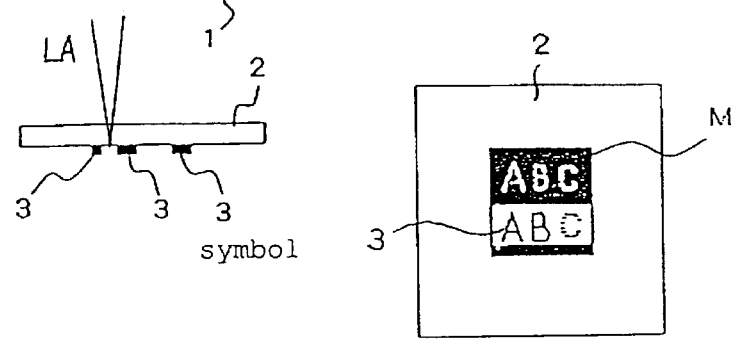

FIG. 1 is a sectional view and a plan view showing the process of the marking method of embodiment 1. In the process, chips $6a$ and $6b$ of 100 $\mu$m in thickness are placed on metal plate 1 formed from titanium as the marking material, and glass plate 2, the material to be marked, is placed on the chips to form a gap of 100 $\mu$m between metal plate 1 and glass plate 2 (FIG. 1($a$)). By using a YAG laser device and adjusting the focus of laser beam LA of 40 $\mu$m in beam diameter onto metal plate 1, a laser beam to a desired area (2 mm square) scanning at 50 $\mu$m interval by means of first laser power (in the present embodiment, not less than 30 W or 30 mJ/pulse).

Accordingly, the metal of metal plate 1 irradiated by the laser beam LA is heated and melted, partially evaporated, ionized or turned to plasma. The metal evaporated, ionized or turned to plasma chemically reacts with the gas in the gap between metal plate 1 and glass plate 2 to produce titanium monoxide, dititanium trioxide and then they deposite to surface $2a$ of glass plate 2. Through the first process described above, a black film M of 0.2 $\mu$m in thickness is formed on glass plate 2 in an area of 2 mm square (FIG. 1($b$)).

Next, the second process is described. In FIG. 1($c$), glass plate 2 formed in the first process is separated from marking material 1 in a stage not shown. By applying a laser beam of 40 $\mu$m diameter to film M on surface $2a$ of the separated glass plate by means of a second laser power (in the present embodiment, less than 30 W or 30 mJ/pulse), the laser beam is scanned so as to form a predetermined character, diagram or symbol. Upon receiving the irradiation of the laser beam, the laser irradiated portion of the film M comprising titanium monoxide, dititanium trioxide are removed from surface $2a$ of glass plate 2. Thus, characters, diagrams or symbols 3 of a clear contrast are marked on glass plate 2. In the present embodiment, a two-dimensional Data Code mark M of 7 cells×7 cells is produced.

The beam diameter of the laser beam used in the present embodiment is 40 $\mu$m as described above, and it succeeded in the embodiment in drawing a diagram having the resolution of the beam diameter. It is noted that when marking is performed according to the prior art using a laser beam of 40 $\mu$m beam diameter, the resolution of the diagram is 50 $\mu$m or more. In other words, according to the present embodiment, it is possible to form a minute mark having resolution the same as that of the laser beam diameter. Further, in the first process and the second process, a beam diameter of a different size can be employed and the laser power can also be changed for each process.

According to the present embodiment, a minute mark can be formed, and besides, since glass plate 2 and metal plate 1 are placed slightly separated from each other, even if the metal is heated to a temperature as high as near the fusion temperature being irradiated by the laser beam, glass plate 2 does not crack or break. Also there is no risk of forming a hollow or a dent in the glass plate, the bending strength of the glass plate is not lowered thereby facilitating mechanical transportation. In the present embodiment, a YAG laser is used, but it is apparent that the same effect can be obtained with an excimer laser or a carbon dioxide gas laser if the laser beam can transmit through the material to be marked.

Further, titanium is used for the metal plate in the above embodiment, marking can be applied to the glass plate in the same way as in the present embodiment by using titanium-niobium alloy, titanium-zirconium alloy, titanium monoxide, titanium hydride, titanium-titanium monoxide compound or the like all including the titanium atom. Further, other than titanium, gold, iron, tungsten, molybdenum, lead, tin, silver, cobalt, chromium, copper, manganese, niobium, nickel, palladium, platinum, ruthenium, vanadium, Ni—Co, Cu—Ni, $Nb_3Sn$, $Fe_3O_4$, $CrO$—$CO_2O_3$, $Fe_2O_3$—$MgO$ can be used.

Further, by appropriately selecting the concentration of the gas contained in the gap, it becomes possible to make the same material as the metal plate deposite to glass plate without going through reaction with the gas. Further even though a glass plate is used in the present embodiment, it is apparent that the same effect will be obtained by using a material with laser transmittive.

Further, in the present embodiment, particularly as the marking material, SUS301, SUS304, SUS310S, SUS405, SUS430, SUS447J1, SUS403, SUS410, SUS440A, S10C, S25C, S35C, S45C are used and marking is applied to the glass plate according to the procedure shown in FIG. 1. Fused silica is used as the glass plate. A two-dimensional Data Code thus marked on the glass plate has a clear contrast independent of the marking material used, and gives good recognition results by means of a data code reader at the time immediately after marking.

In a manufacturing process of the plasma display panel, the glass plate marked with a code is heat-treated in the manufacturing process at about 600° C. In a manufacturing process of the liquid crystal panel, the glass plate marked with a code is heat-treated in manufacturing process at about 300° C. In the present embodiment, the two-dimensional Data Code mark formed by using each of the above marking material was heat-treated in the atmosphere at a temperature of 650° C. for 30 minutes, and then subjected to the reading test. The reading test consists of reading of each two-dimensional Data Code for 10 seconds with 200 times reading and measures the number of correct reading of the code contents.

Table 1 shows the reading results picked after marking, the reading results picked after heat-treatment of 650° C., 30 minutes in the atmosphere, and composition of marking materials.

TABLE 1

| marking material | correct reading rates (%) | | marking material composition (%) | | | |
| | after making | after heat-treatment in atmosphere 650° C., 30 min. | Fe | Cr | Ni | C |
| --- | --- | --- | --- | --- | --- | --- |
| SUS301 | 100 | 85 | 72.9 | 17.0 | 7.0 | 0.15 |
| SUS304 | 100 | 82 | 68.7 | 19.0 | 9.3 | 0.08 |
| SUS304L | 100 | 76 | 66.9 | 19.0 | 11.0 | 0.08 |
| SUS301S | 100 | 60 | 50.9 | 25.0 | 20.5 | 0.08 |
| SUS405 | 100 | 93 | 85.7 | 12.3 | 0 | 0.08 |
| SUS430 | 100 | 89 | 81.1 | 17.0 | 0 | 0.12 |
| SUS447J1 | 100 | 78 | 68.9 | 30.3 | 0 | 0.01 |
| SUS403 | 100 | 94 | 85.9 | 12.0 | 0.5 | 0.15 |
| SUS410 | 100 | 92 | 84.3 | 13.0 | 0.5 | 0.2 |
| SUS440A | 100 | 52 | 79.9 | 17.0 | 0.5 | 0.65 |
| S10C | 100 | 94 | 99.2 | 0 | 0 | 0.1 |
| S25C | 100 | 92 | 99.08 | 0 | 0 | 0.22 |
| S35C | 100 | 70 | 98.65 | 0 | 0 | 0.35 |
| S45C | 100 | 50 | 98.55 | 0 | 0 | 0.45 |

It is noted that reading results are represented as correct reading rates. Further, it is also noted that a sum composition of each marking material does not reach 100% in table 1, but this is because the marking material includes other material, such as Si, Mn not listed in the table. The correct reading rate just after marking is 100% for every marking material.

In the present embodiment, when stainless steel is used as the marking material, the marking color changes a little after heat-treatment in the atmosphere at a temperature of 650° C. for 30 minutes, but the marked code further remains sufficiently recognizable for use. In case the marking material is stainless steel of an austenite group such as SUS301, SUS304, SUS310S, the correct reading rate of the code after heat-treatment is 60 to 85%, and the more the marking material contains Ni and Cr components and the lesser contains Fe components, the worse the correct reading rate become. In the case the marking material is stainless steel of a ferrite group such as SUS405, SUS430, SUS447J1, the correct reading rate of the code after heat-treatment is 87 to 93%, and the more the marking material contains Cr components and the lesser contains Fe components, the correct reading rate becomes worse a little. In the case the marking material is stainless steel of a martensite group such as SUS403, SUS410, SUS440, the correct reading rate of the code after heat-treatment is 52 to 94%, and the more the marking material contains Cr components and the lesser contains Fe components, the correct reading rate becomes worse a little. However, the correct reading rate of SUS440A containing much carbon is 52% and lower than that of other stainless marking material. On the one hand, any one of steel group material S10C, S25C, S35C, S45C is used as the marking material, the correct reading rate of the code after heat-treatment is 50 to 94%, and the more the marking material contains C components, the worse the correct reading rate becomes a little. When the carbon content is 0.25% or less, the correct reading rate of the code after heat-treatment is 90%, representing a high recognition ratio. From the above results, with an increased amount of Ni contents in the marking material, the correct reading rate after heat-treatment becomes worse, and with an increased amount of C contents in the marking material, the correct reading rate after heat-treatment is remarkably worse. Further, if the Fe contents in the marking material is increased, the correct reading rate after heat-treatment is raised. Although the reason for the above phenomena is not clear, it is assumed that since a mark produced with a marking material made of stainless material is black or blackish brown, the stainless material which has already been oxidized is formed on the glass plate. This oxide mark is considered as a compound oxide containing elements (Fe, Cr, Ni) of the marking material as primary components, or a mixed oxide, that is, a mixed oxide comprising an iron oxide, a chromium oxide and a nickel oxide. Further, these compound oxides or mixed oxides are oxides slightly reduced and whose color is changed by oxygen when it is supplied in the heat-treatment. Since the correct reading rate is lowered as the amount of Ni is increased, it is presumed that the color change is mainly caused by the change of $NiO_{1-x}$ to NiO which is included in the marked film. Further, with reference to a chromium oxide, the light-shielding-property (the characteristic of light shield) is affected a little by oxidization. Carbon in the marking material exerts a large influence on the mark quality. It is considered that carbon exists in the mark after marking is applied, but is gasified (carbon gas) by heat-treatment. This can be presumed by the fact that the mark formed from the marking material containing a large quantity of carbon such as SUS440A, S45C loses a light shielding property being subjected to the heat-treatment process.

According to the present embodiment, by using stainless steel or steel as the marking material, it becomes possible to produce QR Code, Data Code, Veri Code, or two-dimensional bar codes, or bar codes, each having quality which does not varied when subjected to heat-treatment. Particularly, when the stainless material not containing a large quantity carbon and nickel, like low carbon steel, martensite group or ferrite group stainless steel, is used as the marking material, mark quality does not deteriorate through heat-treatment allowing code recognition of higher reliability. Further, since stainless steel and steel are widely used as structural material, allowing easy machining and grinding, being available at low cost, they contribute to lowering the market price of the marking material.

In the present embodiment, as shown in FIG. 1, the mark of the two-dimensional data code is formed through the first process for depositing the film to the glass plate and the second process for removing the deposited film, but in some cases, the mark is completed by only the first process without going through the second process. In the production line of a liquid crystal panel or a plasma display panel, in some cases, a somewhat large character is marked as the substrate manufacturing number to allow easy recognition. Also in this case, the marking quality of the marking material of the present invention does not deteriorate by heat-treatment, thereby serving to further the cost reduction of the marking material. Further in the present embodiment, a two-dimensional data code is used as the mark to review the recognition performance, however, QR Code, Veri Code, or a two-dimensional bar code which all belong to a minute code or a bar code can be used with sufficient heat-resistance, and hence it is apparent that the mark cost can be reduced thereby.

It is to be noted that, in the present embodiment, SUS301, SUS304, SUS310S, SUS405, SUS430, SUS447J1, SUS403, SUS410 and SUS440A as well as S10C, S25C, S35C and S45C of the JIS (Japanese Industrial Standard) are used as the stainless material, however, other stainless material and steel material of the JIS can also be used. Further, the marking material of the present invention is not limited to the material of the JIS, but mass-produced steel or stainless steel of low price of a foreign standard can be used for the marking material of the present invention.

Further, the liquid crystal panel and the plasma display panel are not only heat-treated by the above temperature, but generally additionally subjected to chemical treatment such as etching in the manufacturing process. Therefore, the formed mark of the two-dimensional bar code or the bar code must be chemicals-proof. In the present embodiment, the marking materials of SUS301, SUS304, SUS310S, SUS405, SUS430, SUS447J1, SUS403, SUS410 and SUS440A as well as S10C, S25C, S35C and S45C are used as manufacturing marks of Two-dimensional Data Code, and the marks are heat-treated at 650° C. for 30 minutes, and then dipped for 10 minutes in 5% hydrochloric acid, 10% hydrochloric acid, and 5% sodium hydroxide aqueous solution, respectively, to produce each sample. After washing each sample with pure water, the correct reading rate of each sample is measured with reference to the Two-dimensional Data Code.

TABLE 2

| | | Correct Reading Rate (%) | | | |
|---|---|---|---|---|---|
| marking material | marking material | heat-treatment in atmosphere, 650° C. - 30 min. | 5% HCl | 10% HCl | 5% NaOH |
| SUS301 | 100 | 85 | 80 | 76 | 84 |
| SUS304 | 100 | 82 | 77 | 73 | 81 |
| SUS304L | 100 | 76 | 70 | 68 | 75 |
| SUS301S | 100 | 60 | 60 | 60 | 60 |
| SUS405 | 100 | 93 | 93 | 85 | 92 |
| SUS430 | 100 | 89 | 89 | 87 | 88 |
| SUS447J1 | 100 | 87 | 85 | 81 | 85 |
| SUS403 | 100 | 94 | 94 | 90 | 92 |
| SUS410 | 100 | 92 | 92 | 89 | 91 |
| SUS440A | 100 | 52 | 52 | 50 | 52 |
| S10C | 100 | 94 | 55 | 35 | 91 |
| S25C | 100 | 92 | 49 | 31 | 90 |
| S35C | 100 | 70 | 33 | 23 | 67 |
| S45C | 100 | 50 | 25 | 13 | 49 |

The correct reading rate of the Two-dimensional Data Code marks whose marking material are stainless steel show substantially the same results with reference to the case after heat-treatment, after being dipped in a hydrochloric acid, and after being dipped in a sodium hydroxide aqueous solution. As describe above, the Two-dimensional Data Code mark formed using stainless steel marking material is a strong mark being acid-proof and alkali-proof in addition to be heat-proof. Compared with a mark using steel marking material later described, a mark using stainless steel as the marking material can be used in the manufacturing process of a common liquid crystal panel or a plasma display panel without any problems and capable of code recognition with high reliability. The mark according to the present invention described above is considered to have a mark film of compound oxides consisting of iron, chromium and nickel.

The Two-dimensional Data Code mark whose marking material is iron steel shows substantially no change in correct reading rate when dipped in sodium hydroxide aqueous solution, however, the correct reading rate becomes worse when dipped in hydrochloric acid. Particularly, when dipped in 10% hydrochloric acid, the correct reading rate becomes worse remarkably, to less than 50% of the value obtained after heat-treatment. However, the marking material of steel is effective in a process in which no acid solution is used.

According to the present embodiment, by using steel or stainless steel as a marking material, it becomes possible to provide a code mark with chemical resistance and high reliability.

(Embodiment 2)

Figure 2:
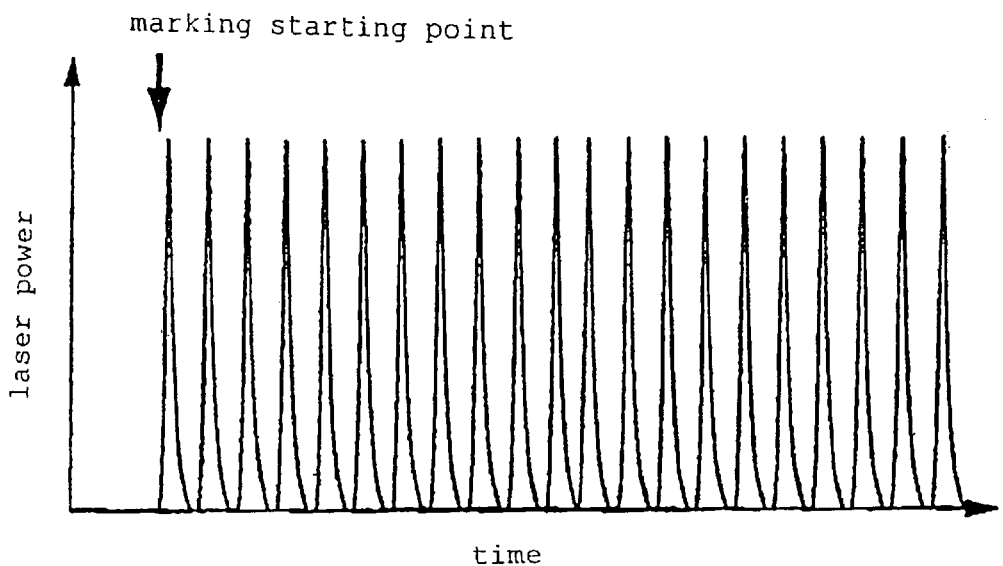
FIG. 2 is a time dependence of YAG laser power.
Figure 3:
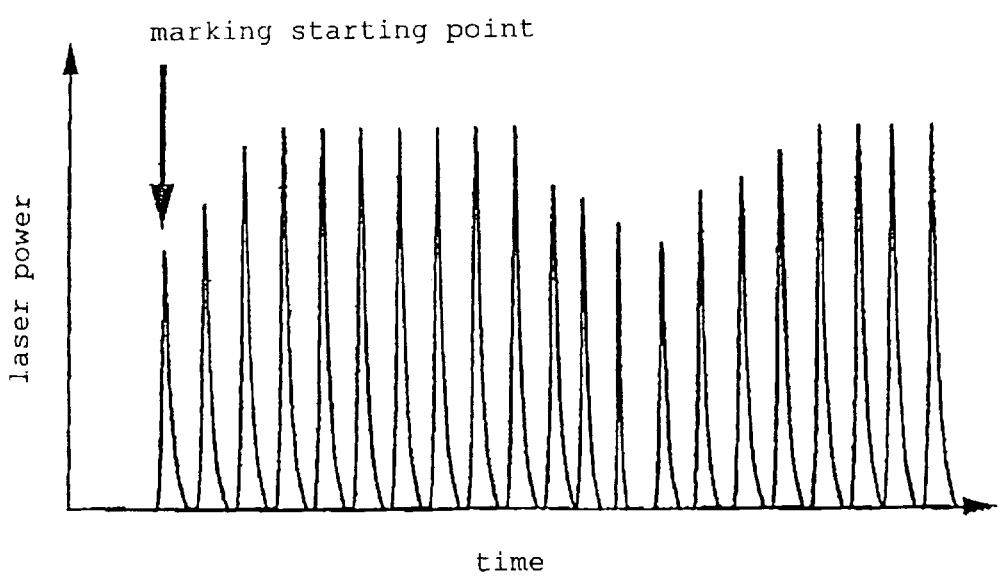
FIG. 3 is a variation of YAG laser power.

As described above, a mark such as a Two-dimensional Data Code mark to be read by transmitted illumination is required to have uniform film thickness throughout the mark. FIG. 2 is a view showing the change of the YAG laser power used in the first process of FIG. 1 through time, in the process of depositing a film to a glass plate. The YAG laser for marking use is generally applied with pulses of 1 to 10 KHz, and uniform marking becomes possible when the peak power of each pulse reaches the same value as shown in FIG. 2. However, according to operating conditions, the YAG laser may possibly occur power fluctuation as shown in FIG. 3. The reason for this power fluctuation is presumed to be mode fluctuation of the laser, fluctuation of the quantity of light of the Krypton arc lamp used as the excitation source of the laser, temperature variation of a coolant for cooling the YAG rod, instability of the Q switch driver for generating the pulse laser, defective adjustment of the optical system, or a defective control method for the first pulse killer at the marking starting point or the like. In recent years, although the performance of lasers have consider ably improved, skilled technique is further required to obtain a laser oscillation of the stable power shown in FIG. 2, and it has been necessary to use the YAG laser with the knowledge that the YAG laser has power fluctuation of about ±10% at the minimum. In the case when marking shown in the present embodiment 1 (FIG. 1) is performed using a laser having power fluctuation as shown in FIG. 3, since the amount of marking material on the glass plate for the mark in the first process varies with the fluctuation of the laser power, the film thickness of the mark also varies. When mark like this is read by a code reader using transmitted illumination, since the light-shielding-property is affected by unevenness of the film thickness, correct code reading is difficult. In the present embodiment, Two-dimensional Data Code marking is prepared by using a metal film formed on the glass plate, a laser transmittive body, and subjected to a reading recognition test to review the performance.

Figure 4:
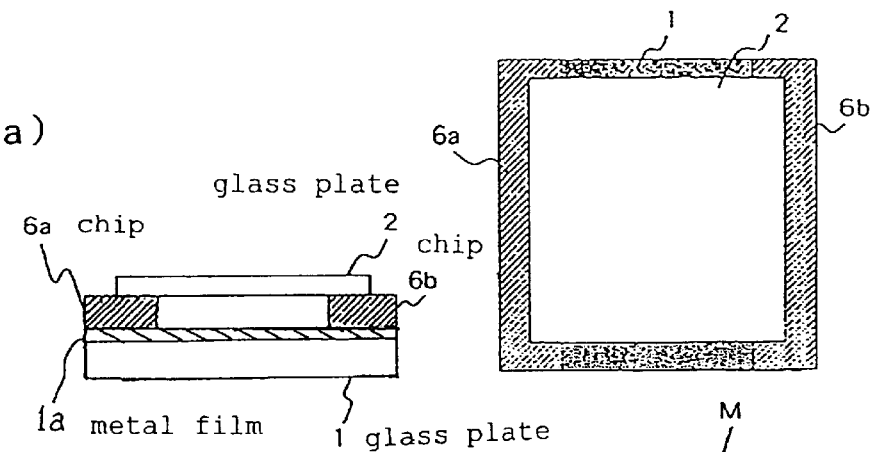
FIG. 4 is a sectional view and a plan view of the marking process with reference to embodiment 2.
Figure 4:
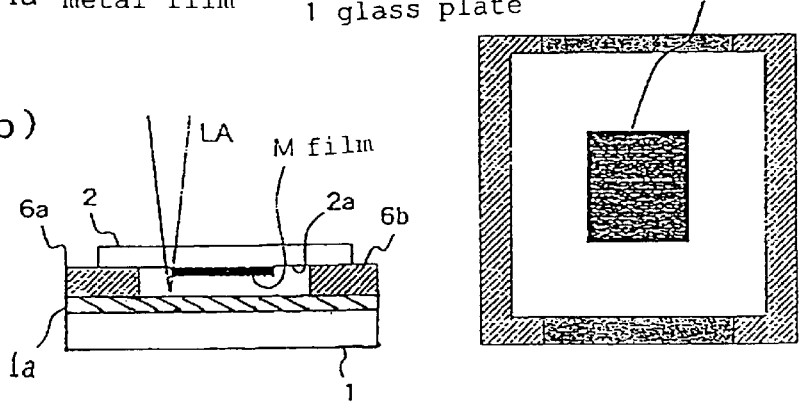
Figure 4:
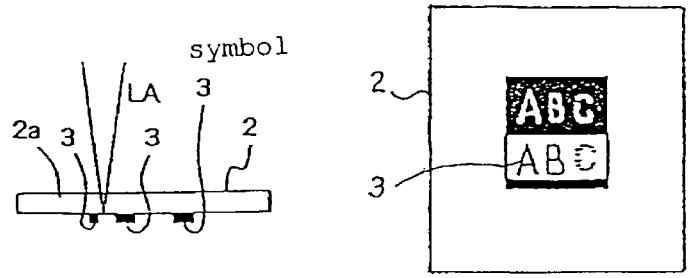

FIG. 4 shows a structure of embodiment 2 and a marking process thereof. In FIG. 4, the symbol 1a represents a thin film such as a metal film formed on glass plate 1b, the numeral 2 a glass plate used as the material to be marked, 6a and 6b are chips to provide a gap between the marking material and the material to be marked (FIG. 4(a)). In the present embodiment, there is provided a gap of about 50 μm. The marking method comprises the steps of scanning and applying a laser beam LA such as the YAG laser to metal film 1a through glass plate 2 to evaporate metal film 1a, thereby making a film M deposit to a specific area of glass plate 2, as shown in FIG. 4(b); successively separating glass plate 2 from glass plate 1b at a Z stage not shown and then scanning the laser beam LA while controlling irradiation thereof by means of a Q switch in order to apply the laser beam LA to the predetermined part of the film M, thereby forming a predetermined figure as shown in FIG. 4(c). In the present embodiment, a Two-dimensional Data Code of 7 cells×7 cells is prepared.

The present embodiment uses chromium for the metal film, soda glass for glass plate 1b, and fused silica for glass plate 2. The two-dimensional Data Code mark formed on glass plate 2 has a clear contrast and is easily recognizable after marking by using a data code reader.

Subsequently, in the process of FIG. 4(b), the quantity of light of a Krypton arc lamp, which is a laser excitation source, is intentionally varied during marking to form the fluctuated state of the laser power shown in FIG. 3, thus forming a Two-dimensional Data Code. The maximum power fluctuation rate at this time is decided as 50% of the peak power. The Two-dimensional Data Code thus formed is easily recognizable by means of the data code reader in the same way as the Two-dimensional Data Code formed in the state with no power fluctuation resulting in the clear mark. When the metal film on the glass plate is used as the marking material in this way, since the heat capacity of the metal film is small compared to that of bulk materials, all the metal film is evaporated by the small laser power and then deposited on the glass plate. Therefore, the metal film is not affected by variation of the laser power, thereby being able to provide a code mark of high reading reliability. Further in the present embodiment, although a chromium films of a thicknesses of 0.1 μm, 0.2 μm, 0.3 μm, 0.5 μm, 0.7 μm, 1 μm, 2 μm, 3 μm, 5 μm, or 10 μm is used as the metal film, all succeeded in forming a clear two-dimensional mark. However, in the case of film thickness of 3 μm or more, a part of the chromium film on glass plate 1b, which is not used for forming the code sometimes strips off at the time of marking, and it is desirable that the film thickness thereof be 2 μm or less for practical use. Further, it is apparent that a Two-dimensional Data Code being heat-and chemicals-proof can be provide when stainless steel or steel is used as the metal film. Other metal film made of the marking material described in embodiment 1 may also be used.

In the present embodiment, although a marking material having a metal film deposited on the glass plate is used, inorganic material such a sapphire, quartz other than glass plate may be used as long as the laser beam transmits through the material. Although the YAG laser is also used in the present embodiment as the laser beam, if it matches the material to be marked, it is allowable to use a carbon gas laser. For example, in the marking operation can be performed with the structure and the process shown in FIG. 4, if a silicon wafer is used as material-to-be-marked, organic matter such as paint or ink or metal such as Cr or gold or inorganic matter such as iron oxide, $SiO_2$, silicon nitride is used as thin film, and a silicon wafer is used as substrate of thin film, paint or ink, Cr or gold, iron oxide or $SiO_2$ or silicon nitrade can be marked on silicon wafer. In the present embodiment, review of recognition performance is performed with reference to the mark expressed with the Two-dimensional Data Code, however, QR Code, Veri Code, or a two-dimensional bar code, each of which in a minute code, or bar code can be used as the code.

Embodiment 1 and embodiment 2 are executed for marking on a liquid crystal panel or a plasma display panel. However, the present invention is not limited to these uses, and if the material to be marked is glass, the present invention can be applied, for example, to window glass of a building, windshield glass of an automobile or a lens of optical equipment such as eyeglasses or a microscopes.

A marking material can be processed by forming a thin film on the surface of a transparent body or a laser transmittive body in each of the other embodiments.

(Embodiment 3)

Figure 5:
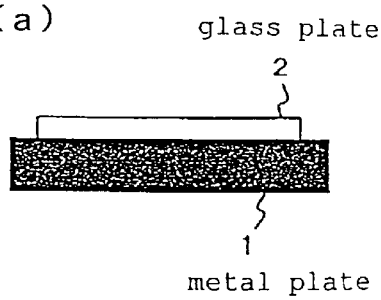
FIG. 5 is a sectional view and a plan view of the marking process with reference to embodiment 3.
Figure 5:
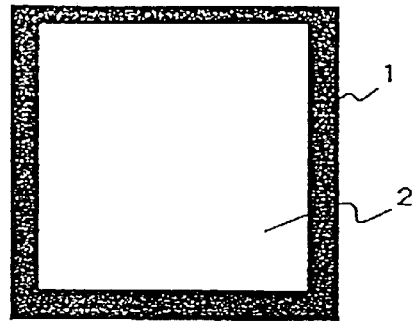
Figure 5:
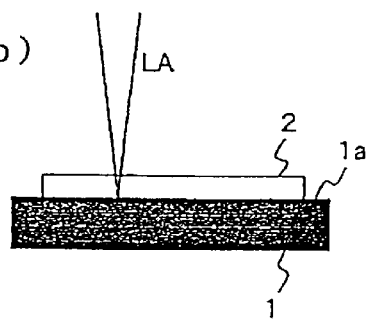
Figure 5:
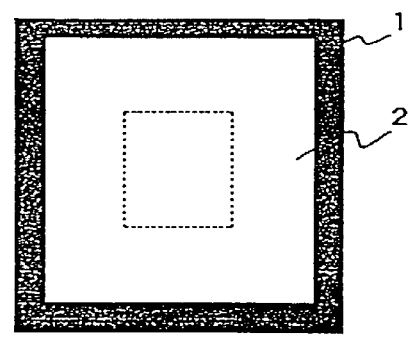
Figure 5:
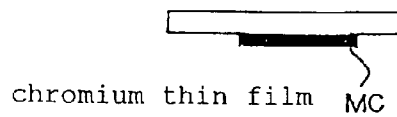
Figure 5:
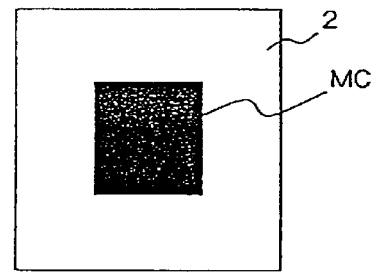
Figure 5:
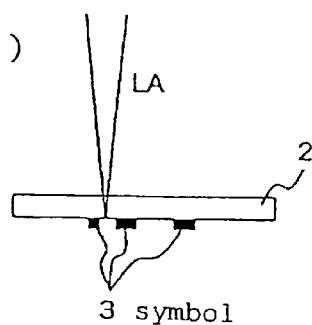
Figure 5:
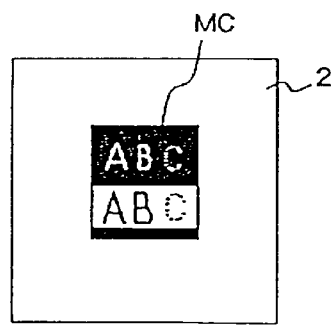

FIG. 5 shows, in sectional views and plan views, a marking method with reference to embodiment 3 of the present invention. In the process, glass plate 2 is placed on metal plate 1 made of chromium (a). Then, by using a YAG laser apparatus, the focus of the laser beam LA is placed on surface 1a of metal plate 1 matched glass plate 2, and the 40 μm diameter laser beam of first laser power (in the present embodiment, 45 W or 45 mJ/pulse or more) scans the area (shown in the FIG. 5(b) by a dotted line, 2 mm square) with an interval of 50 μm (b). When glass plate 2 is separated from metal plate 1, a chromium thin film MC deposited to glass plate 2 is found in the area scanned by the laser beam (c). Further, 40 μm diameter laser beam LA is applied by second laser power on the chromium thin film MC deposited on glass plate 2 and scanned to form a desired character, diagram or symbol (d). The chromium thin film MC irradiated by the laser beam effected by the second laser power (in the present embodiment, 11 W or 11 mJ/pulse or more) is removed to form a character, a diagram or symbol 3. The formed character, diagram or symbol 3 may become the portion where the laser beam is applied and transmits therethrough or a portion on which the chromium thin film MC remains.

Further, in the second process of the present embodiment (FIG. 5(d)), glass plate 2 is marked after being separated from metal plate 1. However, by selecting a scanning method and a laser power appropriately, it is possible to mark to glass plate 2 holding metal plate 1 deposited thereto. In this marking method, through pulsed irradiation and concurrent scanning of the laser beam applied with an appropriate speed keeping the laser power in a range of 5–10 mJ/pulse, the chromium thin film deposited in the first process is removed being instantaneously heated by the pulsed laser beam. By processing in this way, the same mark as that of the above embodiment can be formed.

In the present embodiment 3, character, diagram or symbol 3 having the resolution of a laser beam diameter of 40 μm is formed as in embodiment 1. However, since the glass and the metal is closely contacted, there is a possibility that glass plate 2 may crack or break, and hence it is desirable to have a gap between metal plate 1 and glass plate 2 as shown in embodiment 1.

(Embodiment 4)

Figure 6:
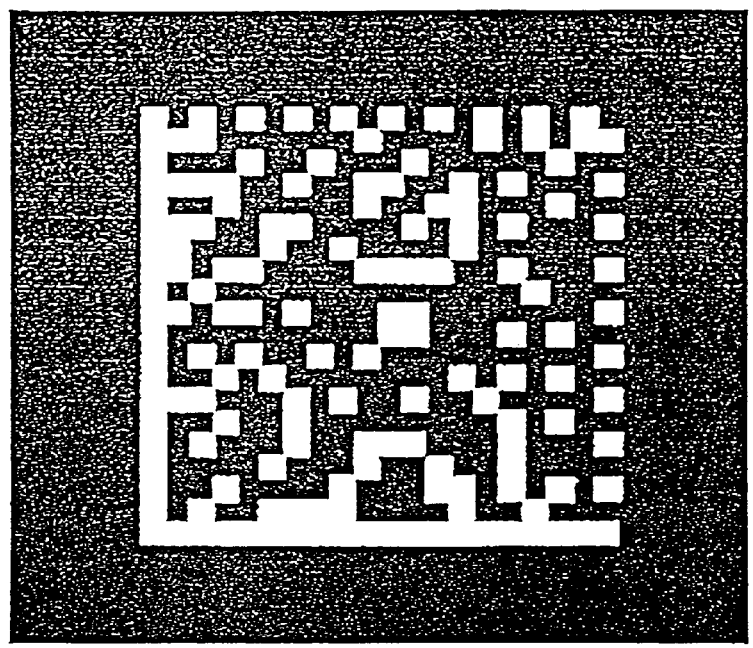
FIG. 6 is a plan view of Two-dimensional Code.

In the present embodiment, a Two-dimensional Code as shown in FIG. 6 is made by using titanium as the material according to the same procedure as that of embodiment 1. Results of marking are shown as parameters of the first laser power and the second laser power. In FIG. 6, a code is composed of 20 cells arranged widthwise and 20 cells arranged lengthwise, in total 400 cells. An L pattern is composed of the left side and the bottom side, and the right side and the upper side pattern have white and black marks arranged therein alternately. Both configurations have a pattern with which a two-dimensional code reader discriminates the position of the code. 18 horizontal and 18 lengthwise directional cells amounting to 324 cells are surrounded by the above four sides and record data such as a diagram, a numeral, or an English character. In other words, the Two-dimensional Code of the present embodiment can record data of 324 bits.

Figure 7:
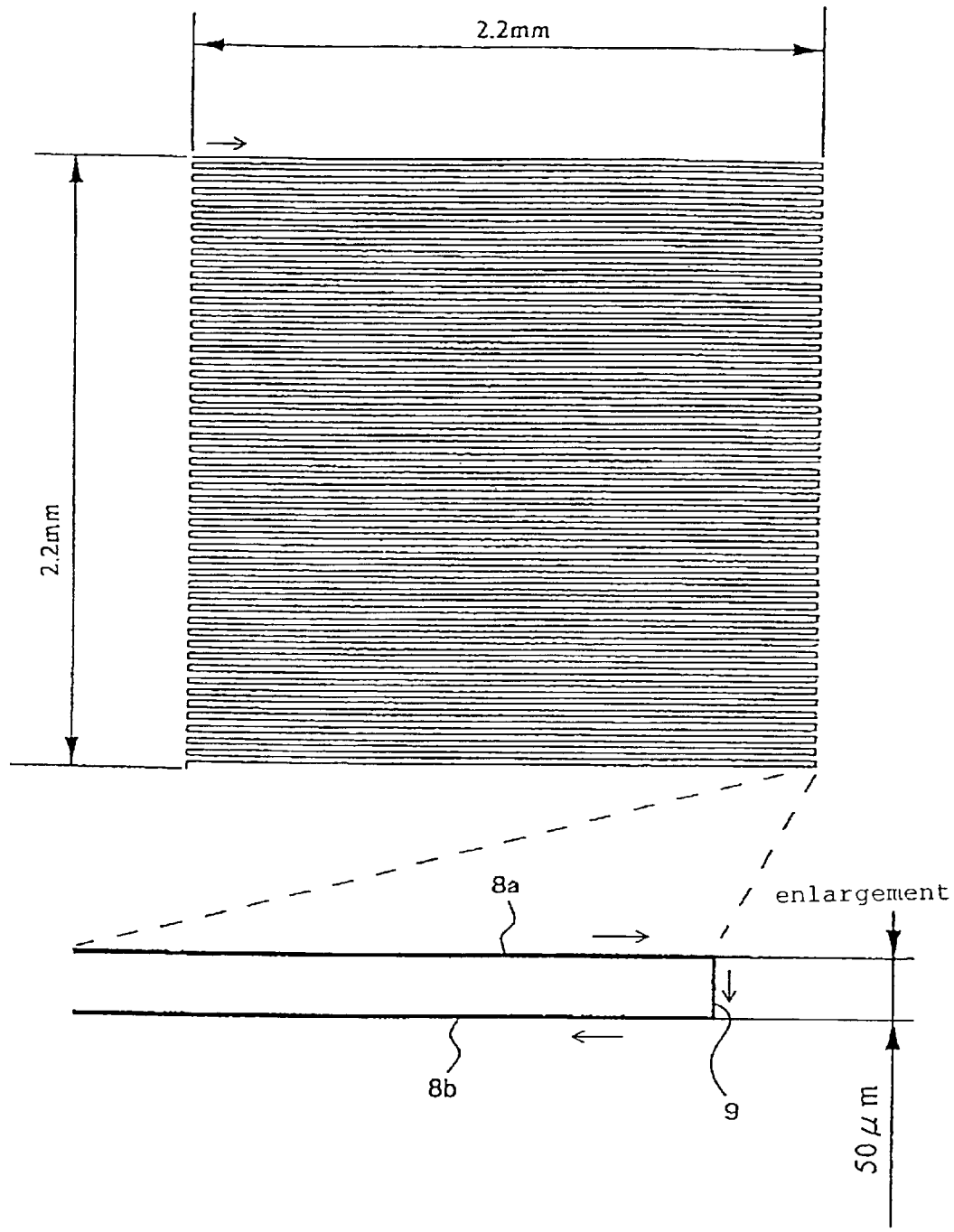
FIG. 7 is a plan view showing laser scanning in the first process.
Figure 8:
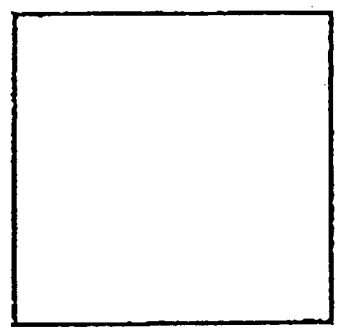
FIG. 8 is a plan view showing laser scanning in a cell of Two-dimensional Code.

A procedure for manufacturing the Two-dimensional Code comprises the steps of scanning the laser beam in the first process by a 50 μm interval as shown by the arrow mark in FIG. 7. Then, forming each square cell of a white ground by scanning and applying the laser beam to form a pattern of a □ type as shown in FIG. 8 by the second laser power (10 W in the present embodiment) in the second process, thereby entering data in 400 cells in total. By scanning the laser beam while keeping the first laser power constant (in the present embodiment, 30 W), the irradiation energy power is raised to increase the amount of metal evaporated at the place where the laser beam turns, corresponding to the left and right sides shown in FIG. 7 (an enlarged part of FIG. 7), thereby increasing the amount of metal deposited to the glass plate, resulting in a Two-dimensional Code having a thick film at the turning point. Therefore, two problems are raised. First, in the second process, the film on the glass plate can not be removed sufficiently at the thick portion, consequently producing specks. Second, since the L pattern formed in the second process requires linking □ patterns together and drawing takes a long time.

Figure 9:
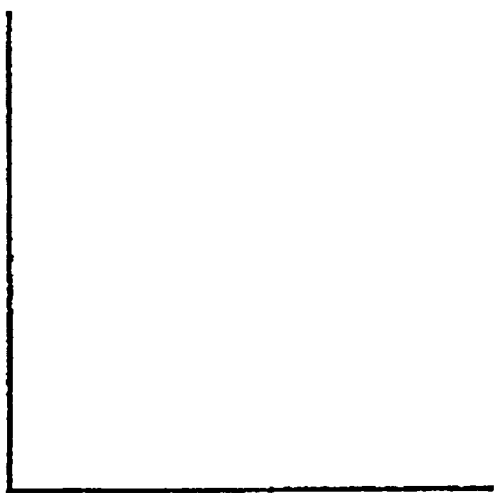
FIG. 9 is a plan view showing laser scanning of the character L pattern.

Therefore, as another embodiment, in the first process in FIG. 7, the laser beam scans to form segment 8a, 8b with a first laser power of 30 W and segment 9 with a first laser power 25 W. Also in the second process, for a part corresponding to the L character pattern, as shown in FIG. 9, it was formed by one stroke with a second laser power of 20 W. As a result, in the first process, an almost uniform film is formed with the thickness within ±3% in variation. Also in the second process, the drawing time for the L pattern is reduced to ⅕. It is to be noted that in the present embodiment, Two-dimensional Codes are made in the first process and the second process by means of two different laser powers, respectively, however, the laser power of three or more grades may be used according to the patterns of characters, diagrams or symbols to be made.

As described above, in the first and second processes, two or more laser power utilization makes it possible to obtain speckless mark. The marking time is also reduced.

(Embodiment 5)

Figure 10:
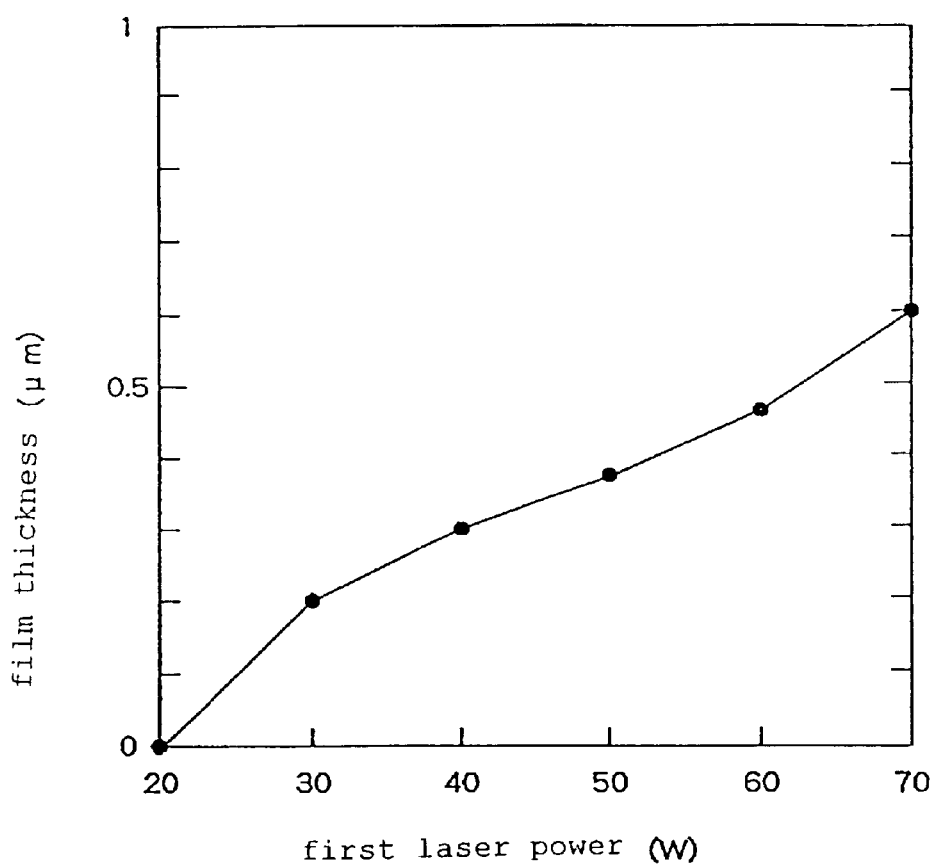
FIG. 10 is a view showing the relationship between the thickness of a film manufactured in the first process and the laser power with reference to embodiment 5.

In the present embodiment, according to the same procedure as that of embodiment 1, titanium was used as the material, and the Two-dimensional Code shown in FIG. 6 was manufactured using the first and the second laser powers as parameters. As parameters a first laser power of 20, 30, 40, 50, 60, 70 w, and a second laser power of 10, 15, 20, 25, 30 w are used. FIG. 10 shows a relation between film thickness of a titanium compound formed on the glass plate and the first laser power. After forming a film with each of the above first laser powers, a two-dimensional code test is performed by applying the laser beam with each of the above second laser power. Table 3 gives the test results.

TABLE 3

| second laser power | first laser power | | | | | |
| --- | --- | --- | --- | --- | --- | --- |
| | 20 W | 30 W | 40 W | 50 W | 60 W | 70 W |
| 10 W | X | ○ | ○ | ○ | ○ | X |
| 15 W | X | ○ | ○ | ○ | ○ | X |
| 20 W | X | ○ | ○ | ○ | ○ | ○ |
| 25 W | X | ○ | ○ | ○ | ○ | ○ |
| 30 W | X | X | ○ | ○ | ○ | ○ |

Manufacturing results were judged by the sample reading test performed with a two-dimensional code reader. In table 3, ○ represents that the sample is readable, and X represents that the sample is unreadable.

With a first laser power of 20W, since there is scarcely any film deposited to the glass plate, no readable Two-dimensional Code is made. Further, since the Two-dimensional Code made by a first laser power of 30W and a second laser power of 30W has a lot of specks, it is unreadable by the two-dimensional code reader. Further, with a first laser power of 70W and a second laser power of 15W or less, the film cannot be perfectly removed, so the mark cannot be read by the two-dimensional code reader. From the above results, it is obvious that a readable Two-dimensional Code can be made when the first laser power is higher than the second laser power.

(Embodiment 6)

Figure 11:
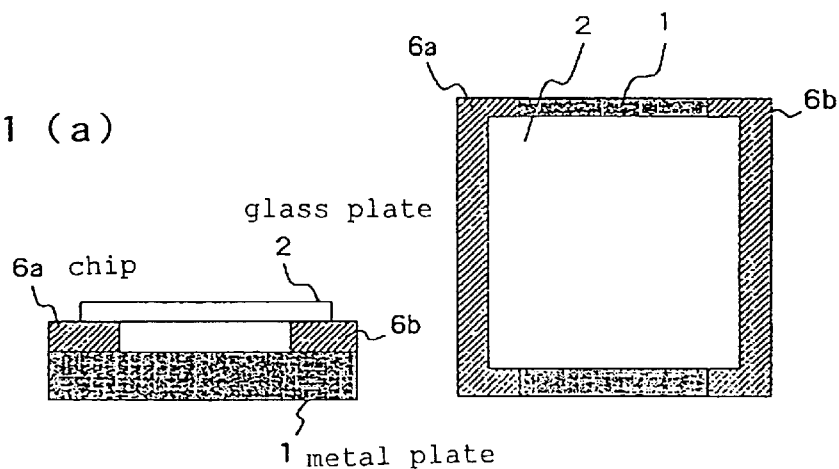
FIG. 11 is a sectional view and a plan view of the marking process with reference to embodiment 6.
Figure 11:
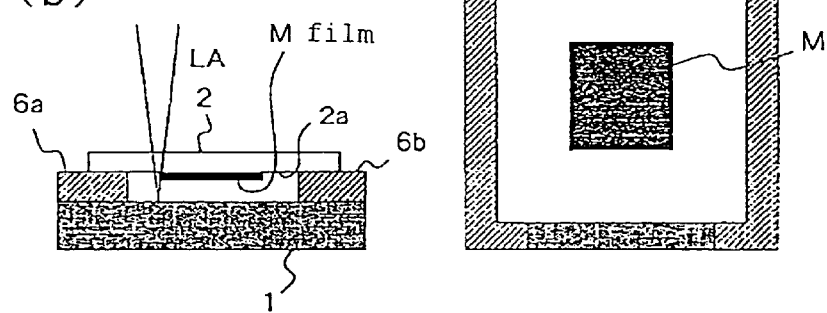
Figure 11:
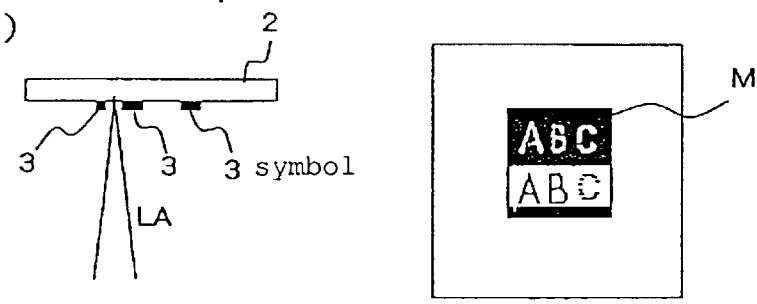

Another marking method will be described in this embodiment. FIG. 11 shows the marking process of this embodiment. In this process, chips 6a and 6b of 100 μm in thickness are placed on metal plate 1 made of titanium, and glass plate 2 is placed on the chips, making a gap of 100 μm between metal plate 1 and glass plate 2(a). By using a YAG laser device and adjusting the focus of the laser beam LA on metal plate 1, a laser beam is scanned to a desired area (2 mm square) with a 50 μm interval by means of the first laser power (in the present embodiment, not less than 30 W or 30 mJ/pulse) The metal of metal plate 1 irradiated by the laser beam LA is heated and melted partially evaporated, ionized or turned to plasma. Metal evaporated, ionized or turned to plasma chemically reacts with the gas component in the gap between metal plate 1 and glass plate 2 to produce titanium monoxide, dititanium trioxide which deposite to surface 2a of glass plate 2. Through the first process described above, a black film M of 0.2 $\mu$m in thickness is formed on glass plate 2 in an area of 2 mm square (b) Subsequently in the second process (c), glass plate 2 is separated from metal plate 1. In applying the laser beam to film M on surface 2a of glass plate 2 formed in the first process by a second laser power (in the present embodiment, less than 10 W or 10 mJ/pulse), the laser beam is scanned to form a predetermined character, diagram or symbol. At this time, the laser beam is applied from the direction reverse to that in (b) . Upon receiving the irradiation of the laser beam, the laser irradiated portion of the film M comprising titanium monoxide, dititanium trioxide is removed from surface 2a of glass plate 2. Thus, characters, diagrams or symbols 3 of a clear contrast are marked on glass plate 2.

The beam diameter of the laser beam used in the present embodiment is 40 $\mu$m, and it has succeeded in drawing a diagram having the resolution of the beam diameter. It is noted that when marking is performed according to the prior art using a laser beam of 40 $\mu$m beam diameter, the resolution of the diagram is 50 $\mu$m or more. In other words, according to the present embodiment, it is possible to form a minute mark having the same resolution as that of the laser beam diameter. Further, in the present embodiment, two independent laser sources are used in a first process and a second process, however, if a process for turning glass plate 2 by 180° is provided between the first process and the second process, the same marking as that of the present embodiment can be made with one laser source.

(Embodiment 7)

Figure 12:
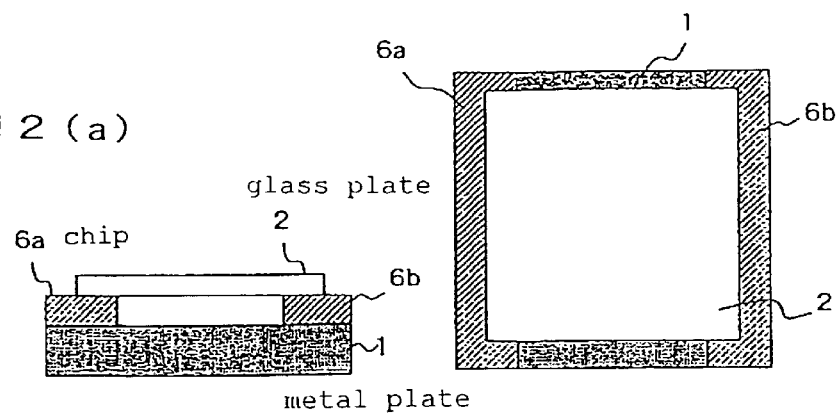
FIG. 12 is a sectional view and a plan view of the marking process with reference to embodiment 7.
Figure 12:
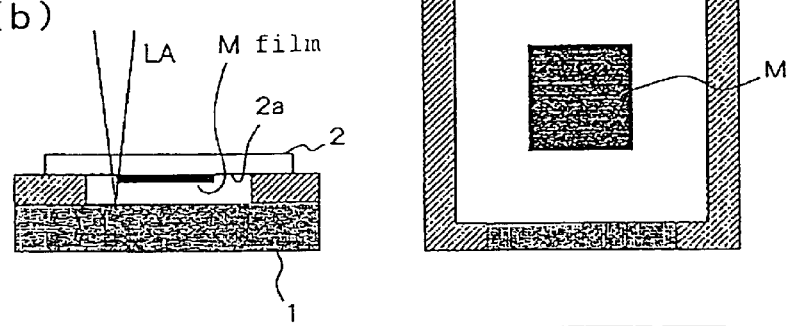
Figure 12:
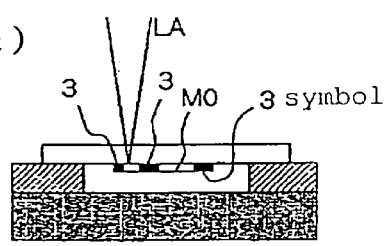
Figure 12:
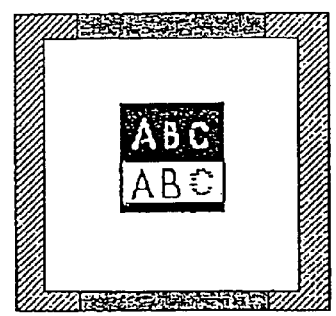
Figure 12:
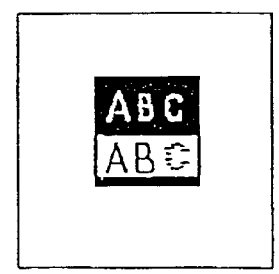

Another marking method will be described in this embodiment. FIG. 12 shows the marking process of the embodiment. In the process, chips 6a and 6b of 100 $\mu$m in thickness are placed on metal plate 1 made of titanium, and glass plate 2 is placed on the chips to form a gap of 100 $\mu$m between metal plate 1 and glass plate 2(a). By using a YAG laser device and adjusting the focus of the laser beam LA on metal plate 1, a laser beam is scanned to a desired area (2 mm square) with a 50 $\mu$m interval by the first laser power (in the present embodiment, not less than 30 W or 30 mJ/pulse). Therefore, the metal on metal plate 1 irradiated by the laser beam LA is heated and melted, partially evaporated, ionized or turned to plasma. Metal evaporated, ionized or turned to plasma chemically reacts with the gas component in the gap between metal plate 1 and glass plate 2 to produce titanium monoxide, dititanium trioxide which then deposite to surface 2a of glass plate 2. Through the first process described above, a black film M of 0.2 $\mu$m thickness is formed on glass plate 2 in an area of 2 mm square (b). Subsequently in the second process (c), by applying the laser beam to the film M on surface 2a of glass plate 2 formed in the first process by the second laser power (in the present embodiment, less than 0.1 W or 0.1 mJ/pulse), the laser beam is scanned to form a predetermined character, diagram or symbol. At this time, the laser beam is scanned in stepping motion so that the laser beam can stay at a predetermined spot for one to two seconds. Upon receiving the irradiation of the laser beam, the laser irradiated portion of the film M comprising titanium monoxide, dititanium trioxide are locally heated by absorption of the laser enegry, thereby changing to titanium dioxide MO. Since the portion changed to titanium dioxide becomes transparent, it becomes possible to perform marking in the same way as in embodiment 1. Here, the change into titanium dioxide to become transparent is called transformation. Through the above process, characters, diagrams or symbols 3 of a clear contrast are marked (d).

The diameter of the laser beam used in the present embodiment is 40 $\mu$m, and it succeeded in drawing a figure having the resolution of the beam diameter. It is noted that when marking is performed according to the prior art using a laser beam of 40 $\mu$m beam diameter, the resolution of the diagram is 50 $\mu$m or more. In other words, according to the present embodiment, it is possible to form a minute mark having the same resolution as the laser beam diameter. Further, in the present embodiment, although titanium is used as the marking material, alloy or a metal compound or a compound containing titanium may be used. Further, it is obvious that the same result as in the present embodiment can be obtained using the material by which film M is formed by heat in the first process and the color of the film M is thermally changed later. It was found in another test that the color of black silver oxide can be changed to lustrous white by depositing the black silver oxide to the glass in the first process and applying the laser beam in the second process to the silver oxide deposited in the first process for reducing and changing to metal silver.

(Embodiment 8)

Figure 13A:
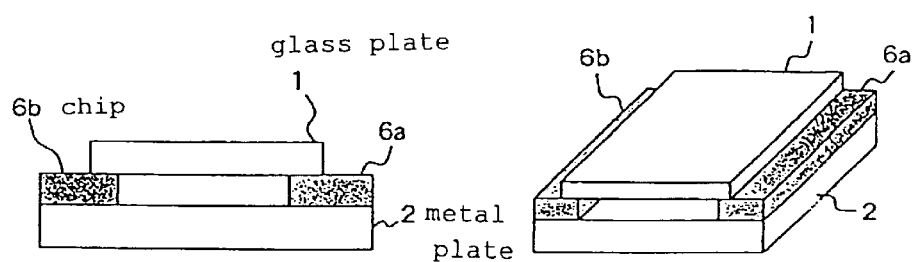
FIG. 13 is a sectional view and a perspective view of the marking process with reference to embodiment 8.
Figure 13B:
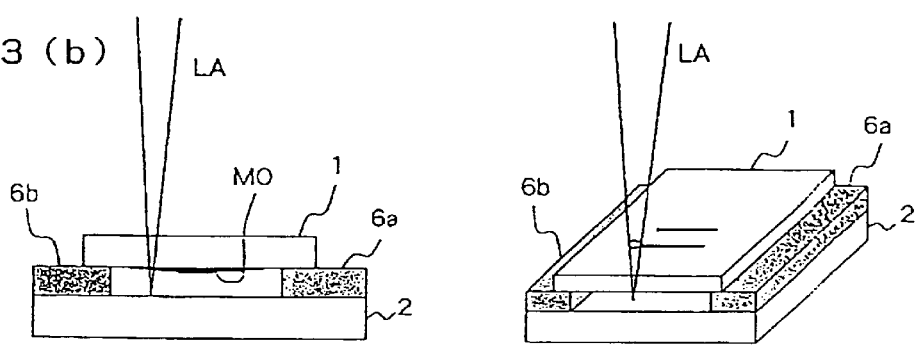
Figure 13C:
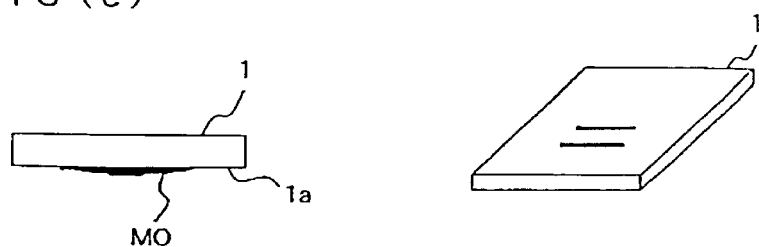
Figure 14:
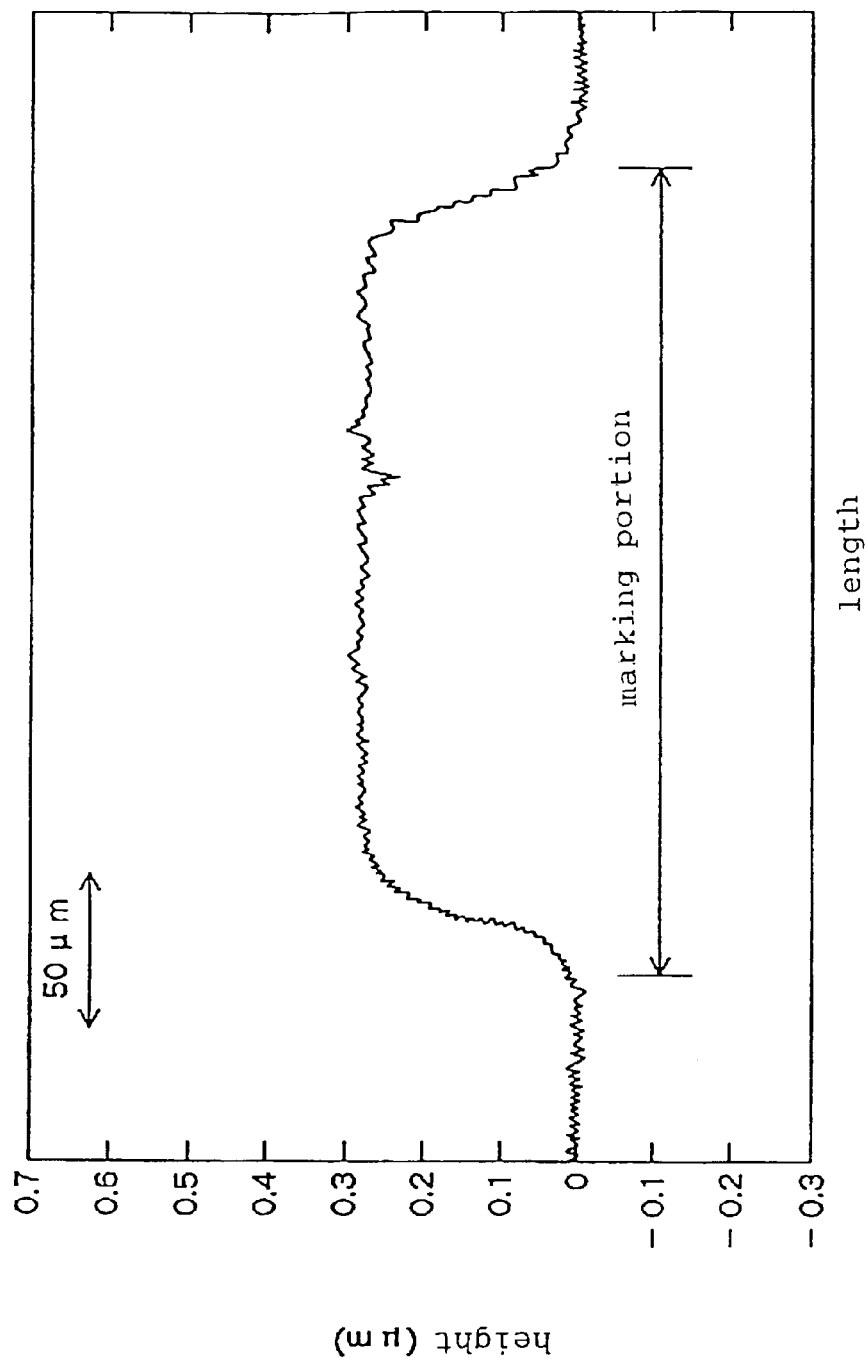
FIG. 14 is a view showing the surface configuration of a mark manufactured by the marking method of embodiment

FIG. 13 shows the process of the marking method of the present invention in perspective views and sectional views. In the process, chips 6a and 6b of 100 $\mu$m in thickness are placed on metal plate 1 made of titanium, and then glass plate 2 is placed on the chips thereby forming a gap of 100 $\mu$m between metal plate 1 and glass plate 2(a). Then, by using a YAG laser device and adjusting the focus of a laser beam LA on metal plate 1, and scanning the surface of metal plate 1 under a predetermined laser irradiation condition at a fixed speed to produce desired characters, diagrams and symbols (b). The metal of metal plate 1 irradiated by the laser beam LA is heated and melted, partially evaporated, ionized or turned to plasma. Metal evaporated, ionized or turned to plasma chemically react with the gas component in the gap between metal plate 1 and glass plate 2, producing a substantially black film M on glass plate 1(c). As a result of an analysis of the film M by X-ray photoelectron spectroscopy, a large quantity of $Ti^{2+}$, $Ti^{3+}$ and $O^{2-}$ were confirmed and also some $N^{3-}$ was detected. Therefore, it is presumed that the greater part of the mark formed on the glass plate is composed of titanium monoxide, dititanium trioxide and that a small quantity of titanium nitride also exists therein FIG. 14 shows data of the surface configuration of the glass after marking is applied, the data being measured by means of a surface roughness instrument. It was confirmed that there was deposited matter of about 0.3 $\mu$m in the marking portion of the glass surface.

According to the marking method of the present invention, since glass plate 2 is separated from metal plate 1, the metal does not directly contact the surface of glass plate 2 even if the metal is melted being irradiated by the laser beam, and hence glass plate 2 is protected against generation of a crack and even when worst comes to worst, perfectly protected against breaking. Further, no dent is formed in glass plate 2, the bending strength of the glass plate is not in the least deteriorated. Besides, since the mark is black, it is easy to recognize and a code is recognizable by a reader such as a bar code reader. It is noted that although a glass plate is used in the present embodiment, it is clear that the same effect will be obtained by using a transparent or a translucent body for a laser beam.

Further, since a clear square mark can be formed on the glass plate according to the present embodiment, a film M can be formed by applying the present embodiment to the first process of embodiment 1, 3, 6 and 7.

(Embodiment 9)

Although the previous embodiments used titanium as the metal plate, the present embodiment uses titanium-niobium alloy, titanium-zirconium alloy, titanium monoxide, titanium hydride, titanium/titanium monoxide compound to apply marking in the same way to the glass plate. Table 4 gives the color of markings obtained by using each of the above material, valence of the titanium atoms of the marked portion obtained by X-ray photoelectron spectroscopy, and a titanium compound identified from the result of X-ray diffraction.

TABLE 4

| material | marking color | valence of titanium | Ti compound to be indentified |
|---|---|---|---|
| titanium-niobium alloy | blackish gray | $Ti^{2+}$, $Ti^{3+}$ | TiO $Ti_2O_3$ |
| titanium-zirconium alloy | dark | $Ti^{3+}$ | $Ti_2O_3$ TiO |
| titanium monoxide | blackish purple | $Ti^{3+}$ | $Ti_2O_3$ |
| titanium hydride | black | $Ti^{2+}$ | TiO |
| titanium-titanium monoxide | black | $Ti^{3+}$ | TiN $Ti_2O_3$ |

As a result, when marking is performed by using titanium-niobium alloy, titanium-zirconium alloy, titanium monoxide and dititanium-trioxide are detected. When titanium monoxide is used for marking, dititanium-trioxide is detected. When titanium hydride is used, titanium monoxide is detected. When titanium-titanium monoxide compound is used, a large quantity of dititanium-trioxide and a small quantity of titanium monoxide are detected. The color when titanium-niobium alloy is used for marking is blackish gray, titanium-zirconium alloy is dark, titanium monoxide is blackish purple, titanium hydride is black, and titanium/titanium monoxide compound is also black. All markings prepared by using the above materials have sufficient contrast for visual recognition. When a bar code was prepared under the above marking conditions and a code recognition test was performed with a bar code reader, every test piece proved to be readable, except titanium-zirconium alloy marking.

Therefore, according to the present embodiment, it is clear that it is possible to provide a sufficiently recognizable mark difficult to attain in the prior art by using a material containing titanium. Further, according to the result of measuring the surface configuration, since there is no damage such as a dent in the glass surface, it is possible to provide a mark with high mechanical strength.

(Embodiment 10)

Figure 15:
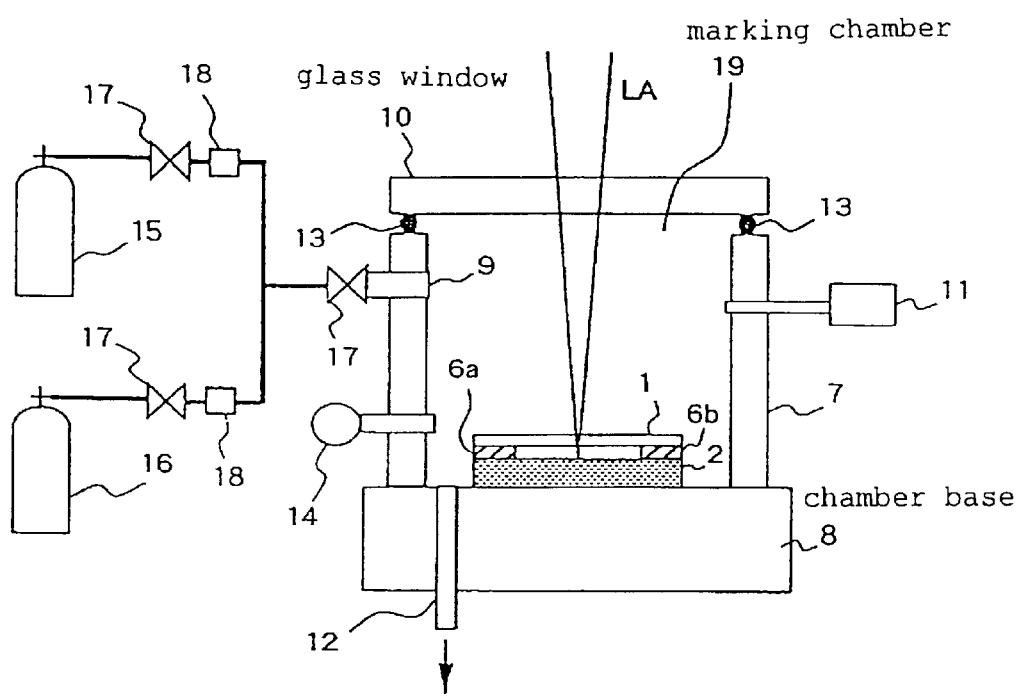
FIG. 15 is a type view of the marking apparatus used in the marking method of embodiment 10.
Figure 16:
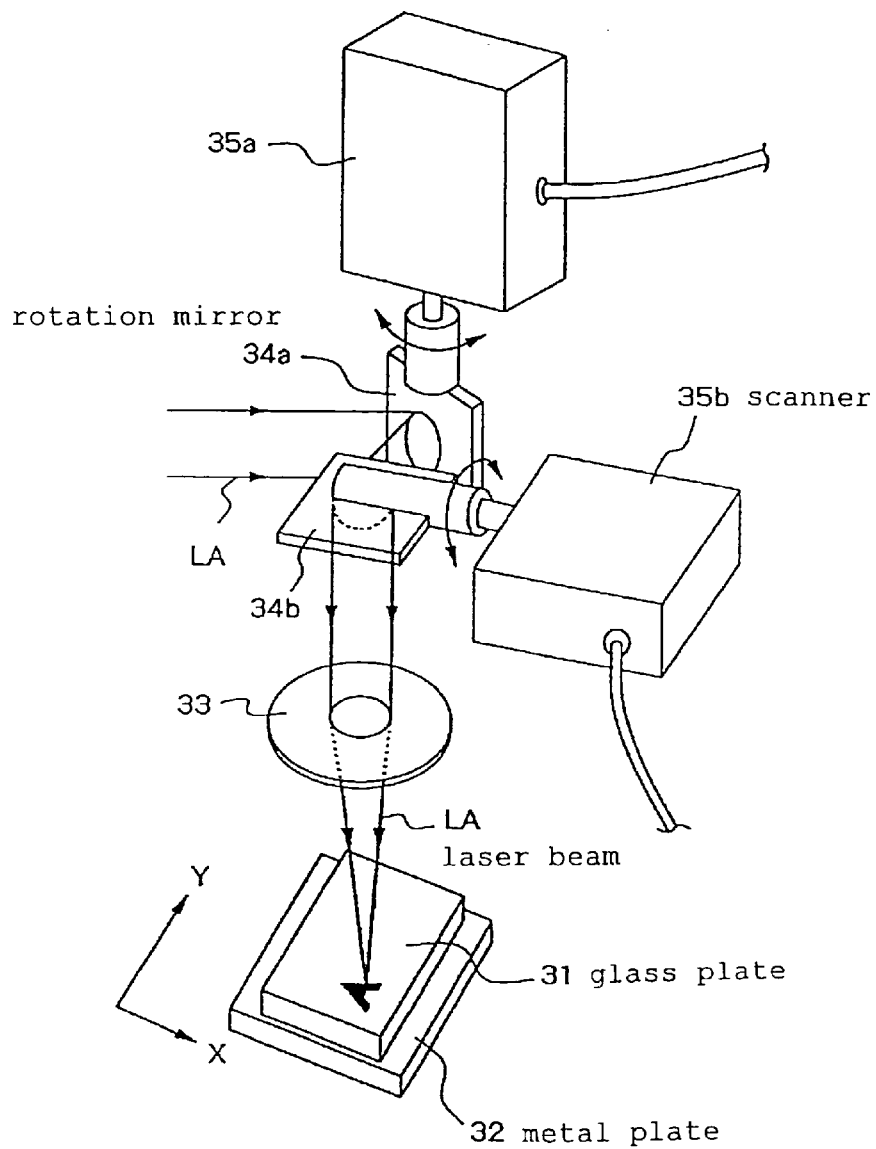
FIG. 16 is a perspective view showing the structure of the main parts of a marking apparatus of the prior art.

In the present embodiment, marking is performed under a predetermined oxygen partial pressure using the apparatus shown in FIG. 15. In FIG. 15, the numeral 7 denotes a chamber wall made of stainless steel, 8 a chamber base made of stainless steel, 9 a gas introduction port, 10 a window made of quartz glass which transmits a laser beam into the chamber, 11 a zirconia gas sensor for measuring concentration of oxygen in the chamber, 12 a gas exhaust port, 13 an O-ring, 14 a pressure gauge for measuring the pressure in the chamber, 15 an oxygen gas cylinder, 16 a cylinder for argon gas which serves as carrier gas, 17 a valve, 18 a gas flow rate controller, 19 a marking chamber. Glass plate 2 is placed on titanium plate 1 forming a gap therebetween by interposing chips 6a, 6b of 100 μm in thickness. The laser beam is applied while scanning so as to form a figure of a bar code and a character under the predetermined gas pressure. First, Oxygen gas is selected as reaction gas and argon is selected as carrier gas, and then setting oxygen partial pressure to 1, 2, 5, 10, 20, 40, 80, 160, 380, 760, 1140, 1520 torr, marking is performed. After finishing marking, the mark has metallic luster with the oxygen partial pressure 1 torr, and then the atom detected by the X-ray photoelectron spectroscopy is only titanium having hardly any oxygen. That is, it is considered that, when the oxygen partial pressure is 1 torr, titanium evaporated by the laser beam LA deposits to glass plate 2 in the state of metal. When the oxygen partial pressure is 2 torr, the mark shows black color with slight metallic luster, and $Ti^{2+}$ and $O^{2-}$ are detected from the result of X-ray photoelectron spectroscopy. In other words, it is presumed that, with an oxygen partial pressure of 2 torr, the part of titanium evaporated by the laser beam has reacted into TiO and mixed with metal titanium. With the oxygen partial pressure of 5 to 760 torr, the mark is black and $Ti^{3+}$, $Ti^{2+}$ and $O^{2-}$ are detected from the result of the X-ray photoelectron spectroscopy. In other words, it is presumed that, with an oxygen partial pressure of 5 to 760 torr, the titanium evaporated by the laser beam has reacted into TiO, $Ti_2O_3$ and mixed with metal titanium. With an oxygen partial pressure of 1140 torr or more, the mark is white and $Ti^{4-}$ and $O^{2-}$ are detected from the result of the X-ray photoelectron spectroscopy. Specifically, it is presumed that, with an oxygen partial pressure of 1140 torr or more, the titanium evaporated by the laser beam has oxidized into $Tio_2$ and exists as $TiO_2$ being mixed with metal titanium.

As described above, according to the present embodiment, it is possible to provide a mark with a visually recognizable contrast under an oxygen partial pressure of 5 to 760 torr. Further, with reference to bar code figures, it was found that a clear mark is provided which can be read by a bar code reader without fail. Further, in the present embodiment, marking is performed in the same way using, in addition to alloy and compounds containing titanium atom, metal such as silver, gold, cobalt, chromium, copper, iron, manganese, molybdenum, niobium, nickel, lead, palladium, platinum, ruthenium, silicon, tin, vanadium, tungsten, zinc, and zirconium, alloy such as Ni—Co or Cu—Ni, an intermetallic compound of $Nb_3Sn$, a metal compound of $Fe_3O_4$, and a compound of CrO—$Co_2O_3$ and $Fe_2O_3$—MgO. As a result, a substantially black mark on the glass surface is successfully formed when marking is performed using silver, cobalt, chromium, copper, manganese, niobium, nickel, palladium, platinum, ruthenium, vanadium, Ni—Co, Cu—Ni, $Nb_3Sn$, $Fe_3O_4$, CrO—$Co_2O_3$ and $Fe_2O_3$—MgO. Moreover, when gold is used, a mark of lustrous red, when iron or tungsten is used, a mark of dark brown, with molybdenum a mark of gray, with lead a mark of reddish yellow, and with tin a mark of blue are formed on the glass plate. However, when silicon, zinc or zirconium is used, the color of the mark is white. In other words, according to the present embodiment, if the matter to be evaporated upon receiving laser irradiation can form a colored reaction product through reaction with oxygen, then a recognizable mark can be produced. Further, since the result of measuring the surface configuration shows no damage such as a dent in the glass surface, a mark with high mechanical strength can be provided.

Further, it is noted that a film M can be effectively formed by applying the marking material used in the present embodiment. That is, metal such as gold, silver, cobalt, chromium, copper, manganese, niobium, nickel, lead, palladium, platinum, ruthenium, silicon, tin, vanadium, tungsten, and alloy made of Ni—Co or Cu—Ni, an intermetallic compound of $Nb_3Sn$, a metal compound of $Fe_3O_4$, and a compound of CrO—$Co_2O_3$ and $Fe_2O_3$—MgO, can be applied to the first process of embodiment 1, 3, 6 and 7.

(Embodiment 11)

Oxygen is used as the reaction gas in embodiment 10, however, nitrogen is used as the reaction gas in the present embodiment for the study of marking. The marking apparatus employed has substantially the same structure as that used in embodiment 10. In FIG. 15, a cylinder for nitrogen gas, which serves as the reaction gas, is used in place of oxygen gas cylinder 15, and gas chromatography for measuring the concentration of nitrogen gas is used as sensor 11. Glass plate 1 is placed on metal plate 2 made of titanium, chromium, niobium, or tantalum interposing chips 6a, 6b of 100 μm therebetween for forming a gap. A laser beam is applied while scanning so as to form a figure of a bar code and a character under a nitrogen gas partial pressure of 1, 2, 5, 10, 20, 40, 80, 160, 380, 760, 1140, 1520 torr. As the result, with a nitrogen gas partial pressure 380 torr or more, titanium shows a mark of lustrous bronze, chromium shows a brown mark, niobium and tantalum show a black mark. That is, a mark with a contrast for allowing visual recognition can be provided not only with oxygen reaction gas but with nitrogen reaction gas.

Further, as for a bar code figure, it was found that a clear mark can be provided and read by a bar code reader without fail. Further, since the result of measuring the surface configuration shows no damage such as a dent in the glass surface, a mark with high mechanical strength can be provided.

It is to be noted that a film M can also be formed by applying the marking material proved to be effective in the present embodiment, that is, titanium, chromium, niobium and tantalum, to the first process of embodiment 1, 3, 6 and 7.

(Embodiment 12)

In the present embodiment, using the apparatus shown in FIG. 15, marking was tested under an oxygen partial pressure of 152 torr while maintaining the gap between glass plate 1 and metal plate 2 at 1, 2, 3, 5, 10, 20, 30, 50, 100, 150, 190, 200 and 300 μm. According to the result, the mark has metallic luster for a gap of 1 μm, a black mark with metallic luster for a 2 μm gap, a black mark for 3 to 190 μm gap, and a milky white mark for a 200 μm gap. Specifically, with a narrow gap, metal is not oxidized and deposites to the surface of glass plate 1 without being changed. With 2 to 190 μm gap, evaporated titanium forms Tio, $Ti_2O_3$ through oxidizing reaction and deposite to the surface of glass plate 1, and with a broad gap, a dent is formed in the glass surface as in the prior art and the marked portion looks milky white.

As described above, according to the present embodiment, a clear mark is formed with a gap between 2 μm and less than 200 μm. Further, various marking tests have been tried using several metals other than titanium while varying the gap, and clear marks were successfully obtained using very similar gaps. Moreover, since the result of measuring the surface configuration showed no damage such as a dent on the glass surface, a mark with high mechanical strength can be provided. Further, as described above, although titanium in the metal state deposites to the glass surface when the gap is 1 μm, the metal plate and the glass plate do not directly contact each other because of the gap and marking can be finished without giving a thermal shock to the glass plate. Due to this structure, after marking is completed, no crack is generated in the glass plate and no glass plate is broken, thereby eliminating the problem of the prior art (Japanese Patent Laid-open No. 008634/1994).

(Embodiment 13)

In the present embodiment, it was tried to form marking by applying the laser beam to an indium-tin compound oxide film (hereinafter referred to ITO film) coated on a glass plate with a predetermined laser power (in the present embodiment, 0.08W or less) and by scanning the laser beam so as to form a specific character. In a portion of the ITO film irradiated by the laser beam with the power of 0.02 to 0.08 W, scarcely any change can be detected with the naked eye. However, when the portion of the ITO film irradiated by the laser beam through a band pass filter for transmitting light with wavelength of 700 to 800 nm was checked, it was found that the reflection light is remarkably reduced, and the portions of the ITO film irradiated and not irradiated by the laser beam make a clear contrast which can be easily recognized. That is, the portion irradiated by the laser beam looks black because the light transmits therethrough, and the portion not irradiated by the laser beam looks white because of reflecting the light, thereby producing a mark with a clear contrast. in the present embodiment, characters are recognized due to reflection light, but they can also be recognized in the same way with transmission light. In recognition due to the transmission light, the portion irradiated by the laser beam looks white because the light transmits therethrough, and the portion not irradiated by the laser beam looks black because the light is reflected, thereby producing a mark with a clear contrast. Therefore, if the reflexivity or the transmissivity of the film on the glass plate is varied by irradiation of the laser beam, a recognizable mark can be obtained. In the present embodiment, the laser beam is applied to the ITO film on the glass plate for varying the reflexivity and the transmissivity, however, if a film made of metal, alloy, a metallic compound or a compound of these matters other than the ITO film is used and the reflexivity as well as the transmissivity of the film can be varied by irradiation of the laser beam, it is evident that the same effect will be obtained. Further, by applying the present embodiment to the second process of embodiment 1, a mark of a clear contrast was successfully obtained.

What is claimed is:

1. A method for marking materials using a marking material and a material to be marked consisting of a light transparent body or a laser transmittive body, comprising:

a first process of placing a surface of said material to be marked and a surface of said marking material together with a desired gap therebetween, vaporizing said marking material by irradiating through said material to be marked with a first laser beam while scanning with the first laser beam, and forming a film vaporized from said marking material onto a predetermined area of said material to be marked; and a second process of removing a part of said film formed onto the surface of said material to be marked by irradiating the part of the film with a second laser beam while scanning with the second laser beam;

wherein patterns of characters, diagrams or symbols are formed in the film on said material to be marked by the second process; and wherein said desired gap is between 2 μm and 200 μm.

2. A method for marking materials according to claim 1, wherein power of the first laser beam is greater per unit area than power of the second laser beam.

3. A method for marking materials according to claim 1, wherein the deposited marking material is a thin film formed on the surface of the material to be marked having a thickness from 0.1 μm to 2 μm.

4. A method for marking materials according to claim 1, wherein one of the patterns formed is QR Code, Data Code, Veri Code, a two-dimensional code, or a bar code.

* * * * *